(12) United States Patent  
Leobandung et al.

(10) Patent No.: US 9,985,100 B2  
(45) Date of Patent: May 29, 2018

(54) LOCALIZED AND SELF-ALIGNED PUNCH THROUGH STOPPER DOPING FOR FINFET

(71) Applicant: INTERNATIONAL BUSINESS MACHINES CORPORATION, Armonk, NY (US)

(72) Inventors: Effendi Leobandung, Stormville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/497,894

(22) Filed: Apr. 26, 2017

(65) Prior Publication Data

US 2017/0229544 A1    Aug. 10, 2017

Related U.S. Application Data

(63) Continuation of application No. 14/792,963, filed on Jul. 7, 2015, now Pat. No. 9,698,225.

(51) Int. Cl.
  *H01L 21/338* (2006.01)
  *H01L 29/10* (2006.01)
  (Continued)

(52) U.S. Cl.
  CPC .... *H01L 29/1083* (2013.01); *H01L 21/02236* (2013.01); *H01L 21/02381* (2013.01); *H01L 21/02532* (2013.01); *H01L 21/2236* (2013.01); *H01L 21/324* (2013.01); *H01L 21/823431* (2013.01); *H01L 21/823481* (2013.01); *H01L 27/0886* (2013.01); *H01L 29/161* (2013.01); *H01L 29/36* (2013.01); *H01L 29/6653* (2013.01); *H01L 29/6656* (2013.01); *H01L 29/7851* (2013.01)

(58) Field of Classification Search
  CPC ....... H01L 21/20; H01L 21/28; H01L 21/336; H01L 29/772; H01L 29/66537; H01L 29/1083; H01L 29/161; H01L 21/823431; H01L 21/324
  USPC ............... 438/299, 478, 174, 181, 194, 440; 257/288, 327, 328, E21.54, E21.255, 257/E29.001
  See application file for complete search history.

(56) References Cited

U.S. PATENT DOCUMENTS 8,048,723 B2    11/2011    Chang et al.
8,394,690 B2     3/2013    Ikeda et al.
(Continued)

OTHER PUBLICATIONS

List of IBM Patents or Patent Applications Treated as Related dated Apr. 26, 2017, 2 pages.

(Continued)

*Primary Examiner* — Robert Huber
*Assistant Examiner* — Eric W Jones
(74) *Attorney, Agent, or Firm* — Tutunjian & Bitetto, P.C.; Vazken Alexanian

(57) ABSTRACT

A method for doping punch through stoppers (PTSs) includes forming fins in a monocrystalline substrate, forming a dielectric layer at a base portion between the fins and forming spacers on sidewalls of the fins down to a top portion of the dielectric layer. The dielectric layer is recessed to form gaps between the top portion of the dielectric layer and the spacer to expose the fins in the gaps. The fins are doped through the gaps to form PTSs in the fins.

19 Claims, 7 Drawing Sheets

(51) Int. Cl.
*H01L 21/8234* (2006.01)
*H01L 21/223* (2006.01)
*H01L 21/324* (2006.01)
*H01L 29/66* (2006.01)
*H01L 29/78* (2006.01)
*H01L 29/36* (2006.01)
*H01L 21/02* (2006.01)
*H01L 29/161* (2006.01)
*H01L 27/088* (2006.01)

(56) References Cited

U.S. PATENT DOCUMENTS

| | | | |
|---|---|---|---|
| 8,420,459 B1 | 4/2013 | Cheng et al. | |
| 8,450,813 B2 | 5/2013 | Luo et al. | |
| 8,759,943 B2 | 6/2014 | Tseng et al. | |
| 8,809,178 B2 | 8/2014 | Liu et al. | |
| 8,841,188 B2 | 9/2014 | Reznicek et al. | |
| 2005/0136582 A1* | 6/2005 | Aller | G06F 17/5068 438/197 |
| 2006/0244051 A1* | 11/2006 | Izumida | H01L 29/66818 257/327 |
| 2008/0001171 A1 | 1/2008 | Tesuka et al. | |
| 2010/0213548 A1* | 8/2010 | Chang | H01L 21/823878 257/348 |
| 2011/0108920 A1* | 5/2011 | Basker | H01L 21/845 257/351 |
| 2012/0292672 A1* | 11/2012 | Cho | H01L 21/823431 257/288 |
| 2014/0098487 A1 | 4/2014 | Hartman et al. | |
| 2016/0308032 A1* | 10/2016 | Glass | H01L 29/66795 |

OTHER PUBLICATIONS

Lee, J.W., et al., "Plasma doping and reduced crystalline damage for conformally doped fin field effect transistors," Applied Physics Letters, vol. 102, Jun. 2013. (pp. 1-4).

Okano, T., et al., "Process Integration Technology and Device Characteristics of CMOS FinFET on Bulk Silicon Substrate with sub-10 nm Fin Width and 20 nm Gate Length," IEDM Technical Digest. IEEE International Electron Devices Meeting, Dec. 2005. (pp. 1-4).

U.S. Office Action issued in U.S. Appl. No. 15/782,908 dated Feb. 21, 2018, 8 pages.

\* cited by examiner

LOCALIZED AND SELF-ALIGNED PUNCH THROUGH STOPPER DOPING FOR FINFET

BACKGROUND

Technical Field

The present invention relates to semiconductor devices and processing, and more particularly to devices and methods for doping a self-aligned punch through stopper to improve device channel performance.

Description of the Related Art

High Ge concentration SiGe is a promising channel material for performance improvements in p-type field effect transistors (PFETs) due to the expectation of high mobility. One problem in SiGe PFET fabrication is controlling punch through stopper (PTS) doping. PTS doping should include n-type dopants (such as, As, P, etc.). N-type dopants are known to have extremely high diffusivity in SiGe. This makes it challenging to control PTS doping below a channel region in bulk SiGe fin field effect transistors (finFETs).

SUMMARY

A method for doping punch through stoppers (PTSs) includes forming fins in a monocrystalline substrate, forming a dielectric layer at a base portion between the fins and forming spacers on sidewalls of the fins down to a top portion of the dielectric layer. The dielectric layer is recessed to form gaps between the top portion of the dielectric layer and the spacer to expose the fins in the gaps. The fins are doped through the gaps to form PTSs in the fins.

Another method for doping punch through stoppers (PTSs) includes forming fins in a monocrystalline Si substrate; forming a dielectric layer at a base portion between the fins; mixing Ge in the fins to form SiGe fins, wherein the SiGe fins extend into the monocrystalline Si substrate below the dielectric layer; forming spacers on sidewalls of the SiGe fins down to a top portion of the dielectric layer; recessing the dielectric layer to form self-aligned gaps between the top portion of the dielectric layer and the spacer to expose the SiGe fins in the gaps; plasma doping the fins through the gaps to form PTSs in the SiGe fins; activating the PTSs by annealing; filling the gaps with a same dielectric material as the dielectric layer and etching back the dielectric layer to a position on the spacers.

A fin device having a punch through stopper (PTS) includes a fin disposed between source and drain regions and adjacent to a gate structure. The fin includes a SiGe fin formed in a monocrystalline Si substrate. The SiGe fin has a portion extending above a top surface of the substrate and a second portion buried below the top surface of the substrate. The portion extends above the top surface of the substrate including a first region forming a transistor channel, a second region forming a PTS and a third portion between the top portion of the substrate and the PTS.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
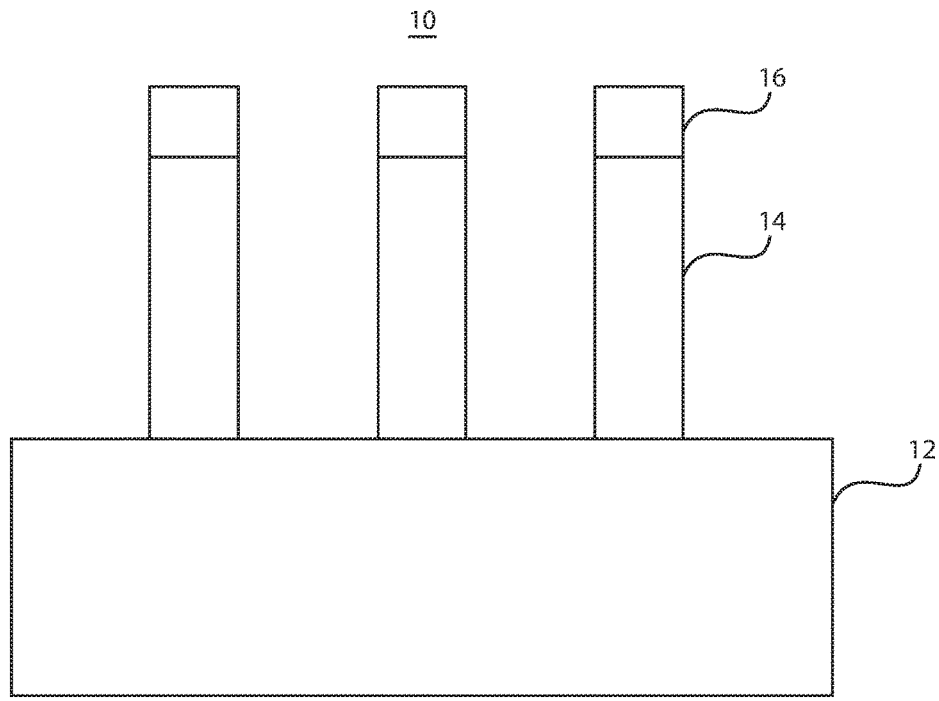
FIG. 1 is a cross-sectional view of a partially fabricated device showing fins formed on a substrate in accordance with the present principles.

In accordance with the present principles, devices and methods are provided to localize punch through stopper (PTS) doping. In accordance with particularly useful embodiments, localizing PTS doping assists in minimizing dopant diffusion into a channel region of a fin field effect transistor (finFET). One embodiment employs SiGe fins with spacers. The spacers are employed to protect sidewalls of the SiGe fins during a doping process. A dielectric layer is recessed to expose lower portions of the fins to n-type dopants during a doping process. The n-type dopants are employed as a PTS region, which acts as a barrier for dopant diffusion between adjacent portions of the fin.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a partially fabricated semiconductor device 10 is illustratively shown. The device 10 includes fins 14 formed on or etched from a bulk substrate 12. In the embodiment shown, the fins 14 have been formed using a patterned hard mask 16 (e.g., SiN or other material). The substrate 12 includes a monocrystalline Si substrate. It should be understood that other embodiments may include the formation of fins on other materials or substrate structures.

The hard mask 16 may be patterned using lithographical processing techniques. A reactive ion etch process may be employed to etch the substrate 12 to form fins 14. In other embodiments, epitaxial growth may be employed to increase the substrate 12 followed by hard mask formation and etching to form fins 14.

Figure 2:
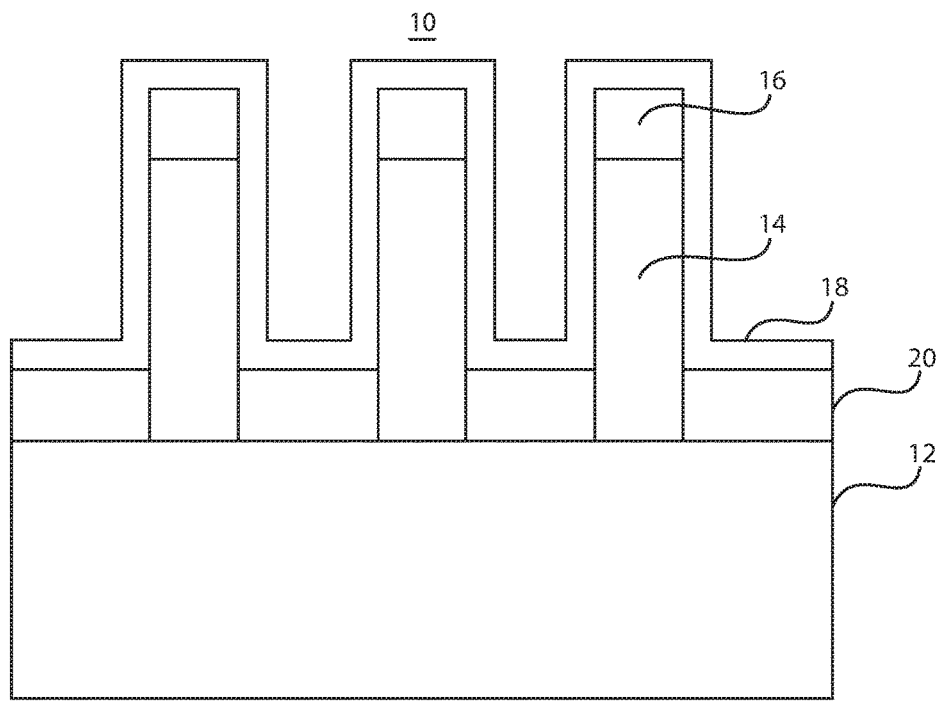
FIG. 2 is a cross-sectional view of the device of FIG. 1 showing the fins covered by a donor layer and a dielectric layer formed between the fins in accordance with the present principles.

Referring to FIG. 2, a dielectric layer 20 is formed between the fins 14 on the substrate 12. In one embodiment, the dielectric layer 20 is grown. In another embodiment, the dielectric layer is deposited, planarized and recessed or etched to the base of the fins 14. The dielectric layer 20 may include an oxide, preferably a silicon oxide. A donor layer 18 of, e.g., SiGe is conformally formed over the hard mask 16 and fins 14. The donor layer 18 is then subjected to a condensation anneal which heats the layer to between about 400 to about 1050 degrees C. for multiple cycles. Each cycle is less than about a minute. The condensation process is performed in the presence of oxygen, such that the Si of the layer 18 reacts with oxygen and is removed while the Ge in the SiGe layer 18 diffuses into the Si material of the fins 14 and the substrate 12.

Figure 3:
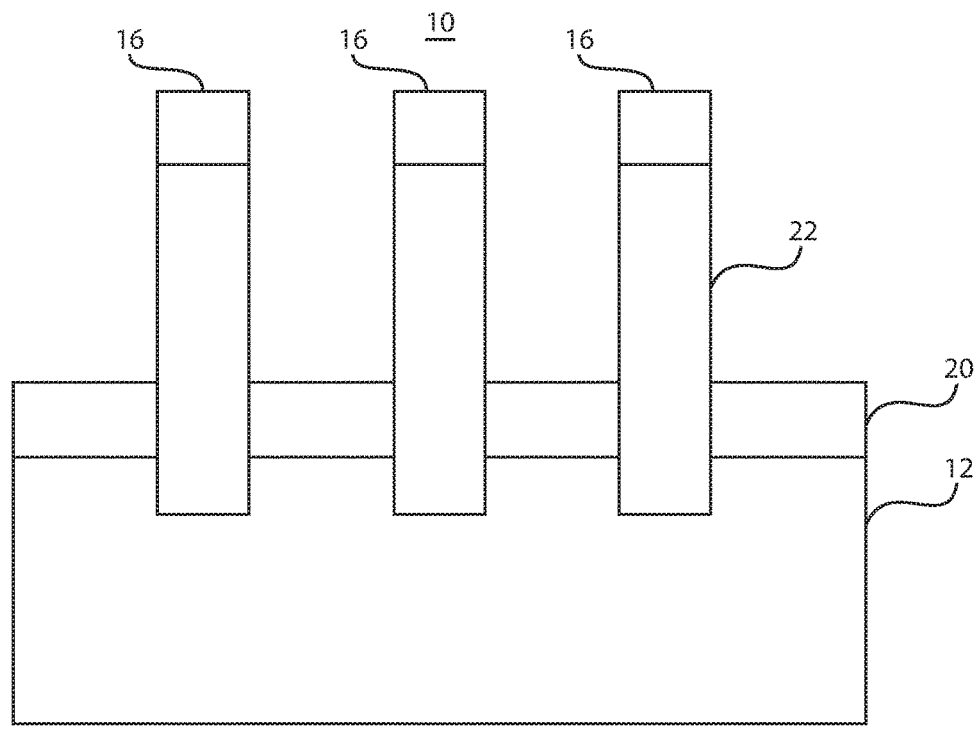
FIG. 3 is a cross-sectional view of the device of FIG. 2 showing the fins mixed with Ge in accordance with the present principles.

Referring to FIG. 3, SiGe fins 22 remain after removal of the SiGe layer 18 by oxidation. The fins 22 extend down into the substrate 12. The fins 22 may include a high concentration of Ge. The amount of Ge in the fins 22 may be controlled by the anneal temperature, the thickness of the layer 18, the amount of time for each cycle and the number of cycles, among other things. The Ge concentration may be between about 10 at % to about 60 at % Ge.

Figure 4:
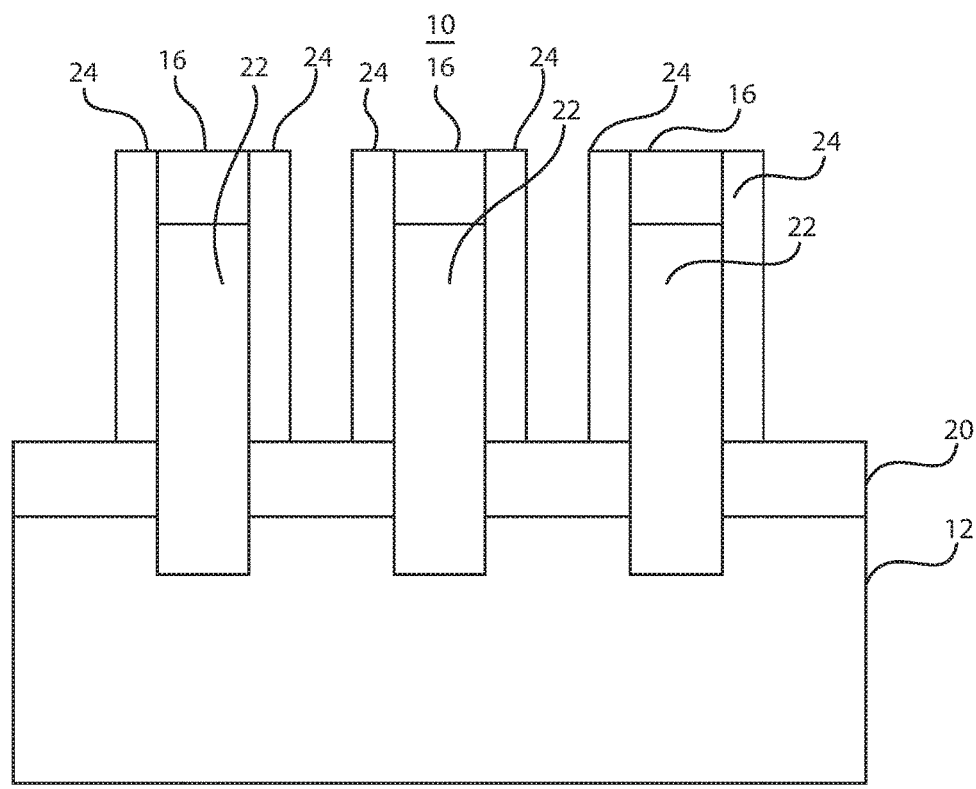
FIG. 4 is a cross-sectional view of the device of FIG. 3 showing spacers formed on sidewalls of the fins down to the dielectric layer in accordance with the present principles.

Referring to FIG. 4, a spacer dielectric layer 24 is conformally deposited over the fins 22 and removed from the hard mask 16 and the dielectric layer 20 by an etch process. The etch process may include a reactive ion etch (RIE) or other etch process that removes the spacer dielectric layer 24 from horizontal surfaces leaving the spacer dielectric layer 24 on vertical surfaces of the fins 22. The spacer dielectric layer 24 may include SiN although other materials may be employed. The materials employed for the dielectric layer 20 need to be capable of selective removal relative to the spacer dielectric layer 24.

Figure 5:
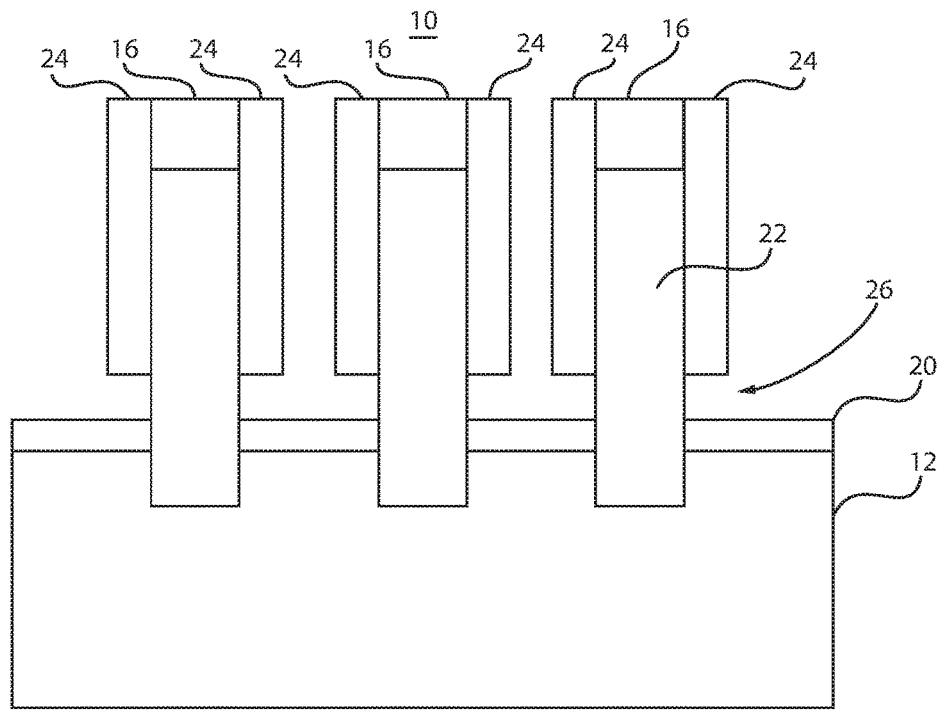
FIG. 5 is a cross-sectional view of the device of FIG. 4 showing the dielectric layer recessed to form gaps below the spacers in accordance with the present principles.

Referring to FIG. 5, the dielectric layer 20 is etched selectively to the spacers 24 and the fins 22. The dielectric layer 20 may be wet or dry etched to uniformly recess the layer 20 to expose the fins 22 below the spacers 24. The dielectric layer 20 may include a thickness of between about 50 nm to about 200 nm. The etching of the dielectric layer 20 may remove enough material to form a gap 26 between the dielectric layer 20 and the spacers 24. The gap 26 should be sized to provide an area where a 10 nm to 50 nm punch through stopper (PTS) will be formed, as will be described. The formation of the gap 26 is a self-aligned process, wherein the gap 26 opens between the spacer 24 and the dielectric layer 20 upon the removal of the dielectric layer 20.

Figure 6:
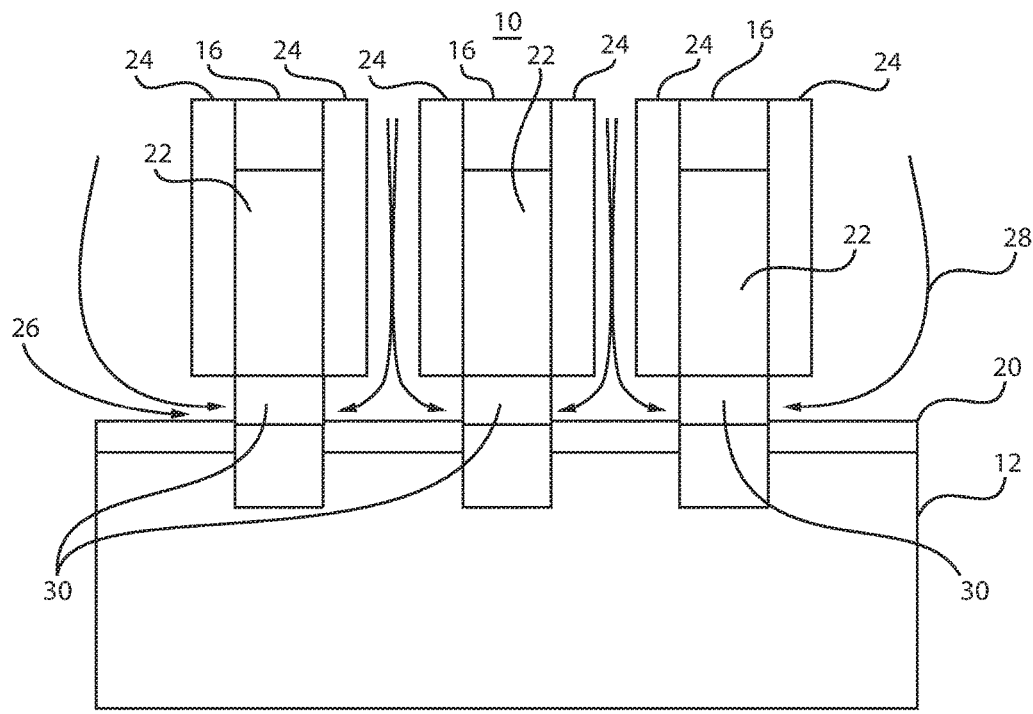
FIG. 6 is a cross-sectional view of the device of FIG. 5 showing punch through stopper doping in the gaps below the spacers in accordance with the present principles.

Referring to FIG. 6, the device 10 is exposed to a plasma doping process. Dopants 28 in the plasma interact with all surfaces and are present in the gaps 26. The dopants 28 diffuse into the fins 22 in the exposed areas of the gaps 26 to form PTS regions 30. The PTS regions 30 are self-aligned on the fin 22 as a result of the self-alignment of the gaps 26. The type of dopants 28 depend on the type of device being fabricated. In one particularly useful embodiment, the devices being fabricated include p-type FETs (PFETs). For PFETs, the dopants may include As, P, or other n-type dopants. The dopant concentration for the dopants 28 should be between about $10^{18}$ to about $10^{20}/cm^3$. The dopant concentration may be adjusted as needed. It should be understood that the dopants 28 may include p-type dopants for PTS regions 30 for n-type FETs (NFETs).

Figure 7:
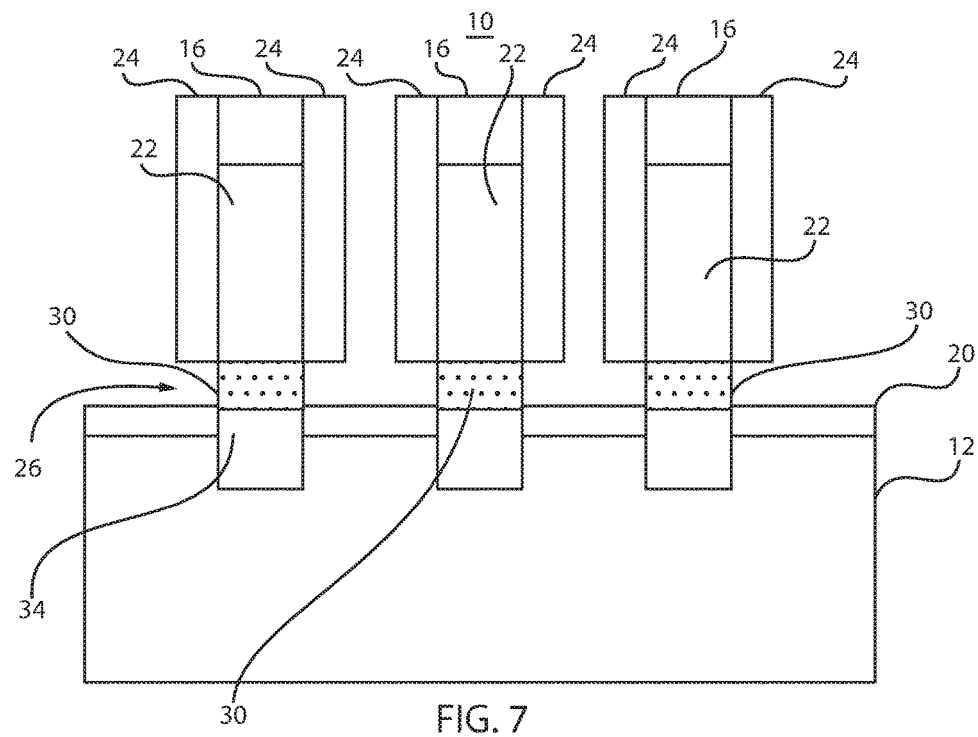
FIG. 7 is a cross-sectional view of the device of FIG. 6 showing punch through stoppers formed in accordance with the present principles.

Referring to FIG. 7, the dopants 28 diffused into the fins 22 are activated. Activation of the dopants in the PTS regions 30 may be performed by performing an anneal process. In one embodiment, the dopants 28 are activated by performing a laser anneal process. The activation may be performed by raising the temperature to, e.g., about 500-1000 degrees C. for 30 seconds, although other anneal times and temperatures may be employed. The activation process makes the PTS regions 30 more homogenous and assists is reducing mass transfer across the PTS regions 30. In other words, PTS regions 30 prevent punch through of dopants between regions 32 and 34 of the fin 22.

Figure 8:
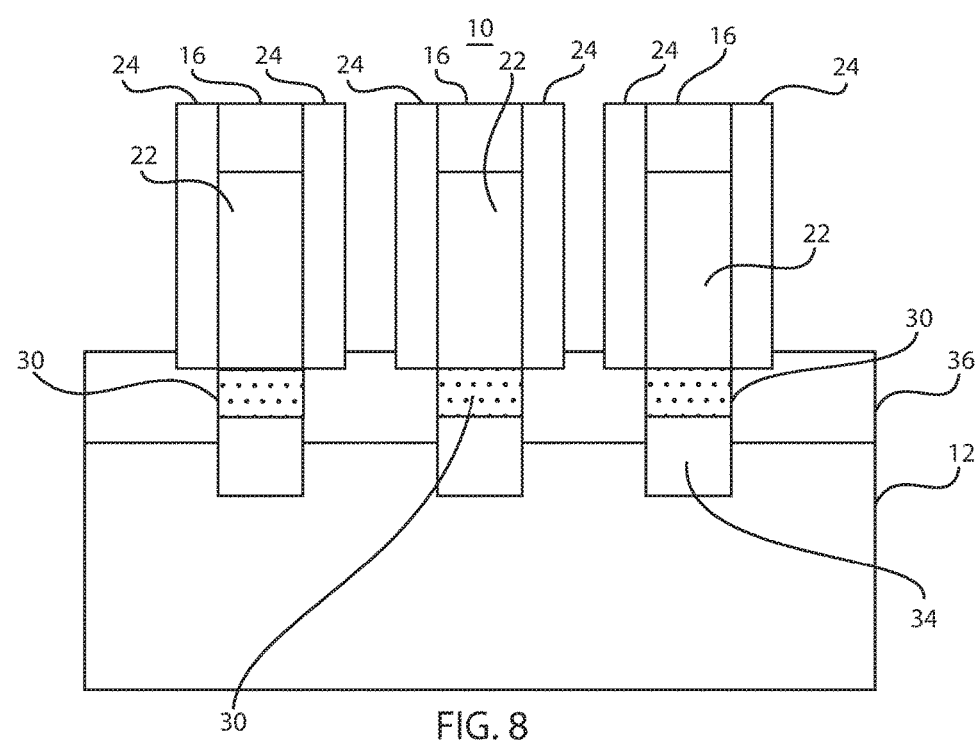
FIG. 8 is a cross-sectional view of the device of FIG. 7 showing the gaps filled with a dielectric material in accordance with the present principles.

Referring to FIG. 8, a dielectric fill 36 is deposited between the fins 22 to fill gaps 26. The dielectric fill 36 is planarized and recessed back to a desired height. The dielectric layer 36 will protect the PTS regions 30 when the spacers 24 are removed as will be described in the next step.

Figure 9:
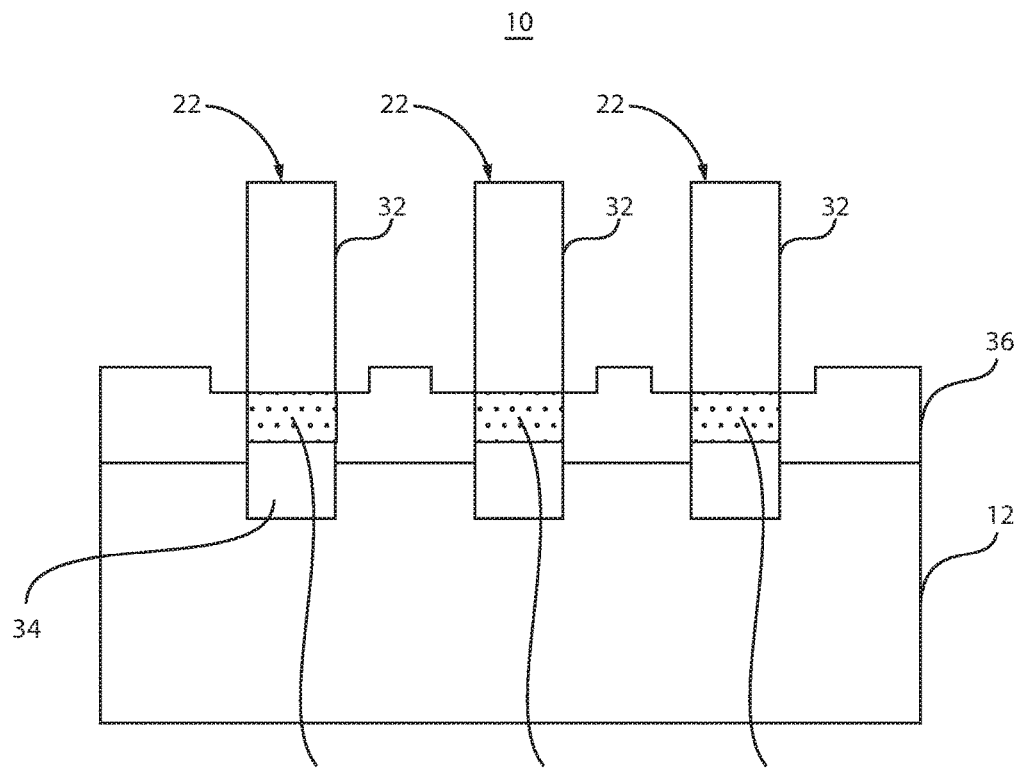
FIG. 9 is a cross-sectional view of the device of FIG. 8 showing the spacers and a hard mask removed in accordance with one embodiment.

Referring to FIG. 9, in one embodiment, the spacers 24 and the hard mask 16 are removed leaving the top and sidewalls of each fin 22 exposed. The region 32 of the fin 22 forms a channel for a finFET device. In accordance with the present principles, a high Ge concentration SiGe channel 32 is formed that enhances performance especially in PFETs by providing high charge mobility. PTS doping with n-type dopants is well controlled by employing a spacer mask (spacers 24, FIG. 7) and the recessed dielectric layer (20, FIG. 7) to provide n-type dopants at a localized position.

Figure 10:
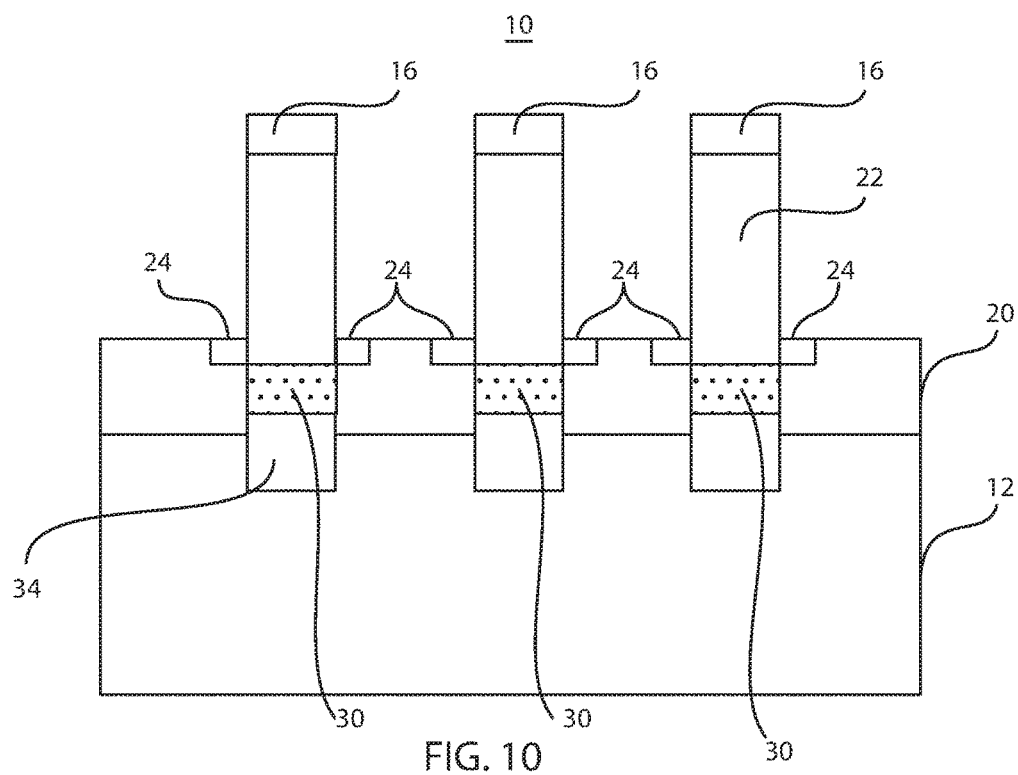
FIG. 10 is a cross-sectional view of the device of FIG. 8 showing the spacers recessed into the dielectric layer in accordance with another embodiment.

Referring to FIG. 10, in another embodiment, instead of completely removing the spacers 24 and the hard mask 16 as in FIG. 9, the spacers 24 may be recessed down into the dielectric layer 20. The hard mask 16 may then be employed for further processing including removing the dielectric layer 20.

Processing can continue in accordance with known processing techniques to form source and drain regions, gate structures, contacts, silicides contact liners and metallizations. The devices formed using the channels 32 may include PFETs or NFETs for fin structures. The fin structures preferably include SiGe channels; however, other materials may be employed using similar processing steps.

It should be understood that the present principles may be applied to any process where spacers can be employed as vertical etch or dopant masks.

Figure 11:
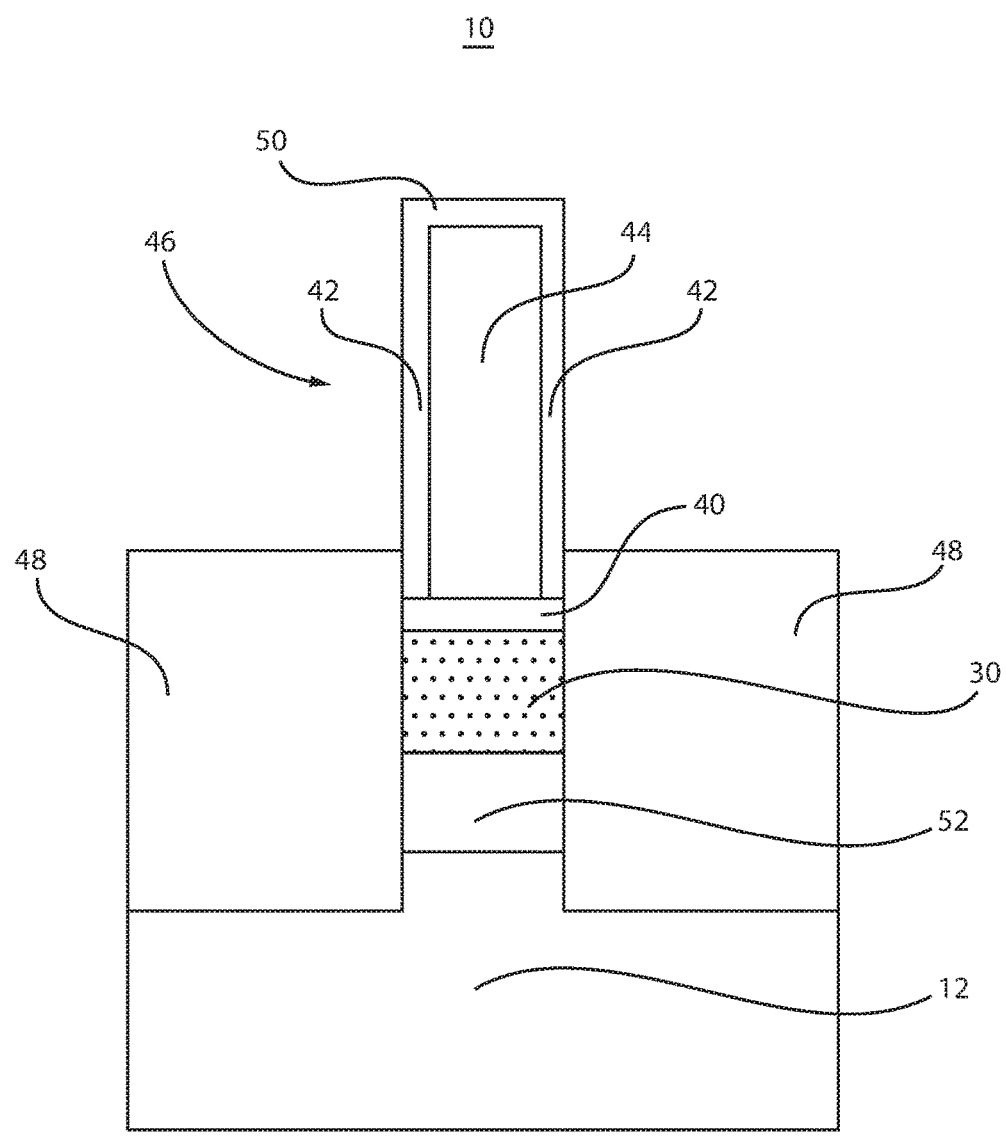
FIG. 11 is a cross-sectional view showing a completed device in accordance with the present principles.

Referring to FIG. 11, a cross-sectional view taken along a fin 22 is shown in accordance with one illustrative embodiment. A gate structure 46 includes a gate dielectric 40, spacers 42 and a gate conductor 44 formed over the fin 22 (into and out of the page). Source and drain regions 48 are disposed adjacent to the fin 22. The gate dielectric 40 may include a high-k dielectric material. The spacers 42 may include a nitride material. A cap layer 50 may also be employed and may include a nitride, similar to the spacers 42. A region 52 includes SiGe formed in the substrate 12 by the Ge condensation process. Additional processing includes forming interlevel dielectric materials, contacts, metallizations, etc., as needed.

Figure 12:
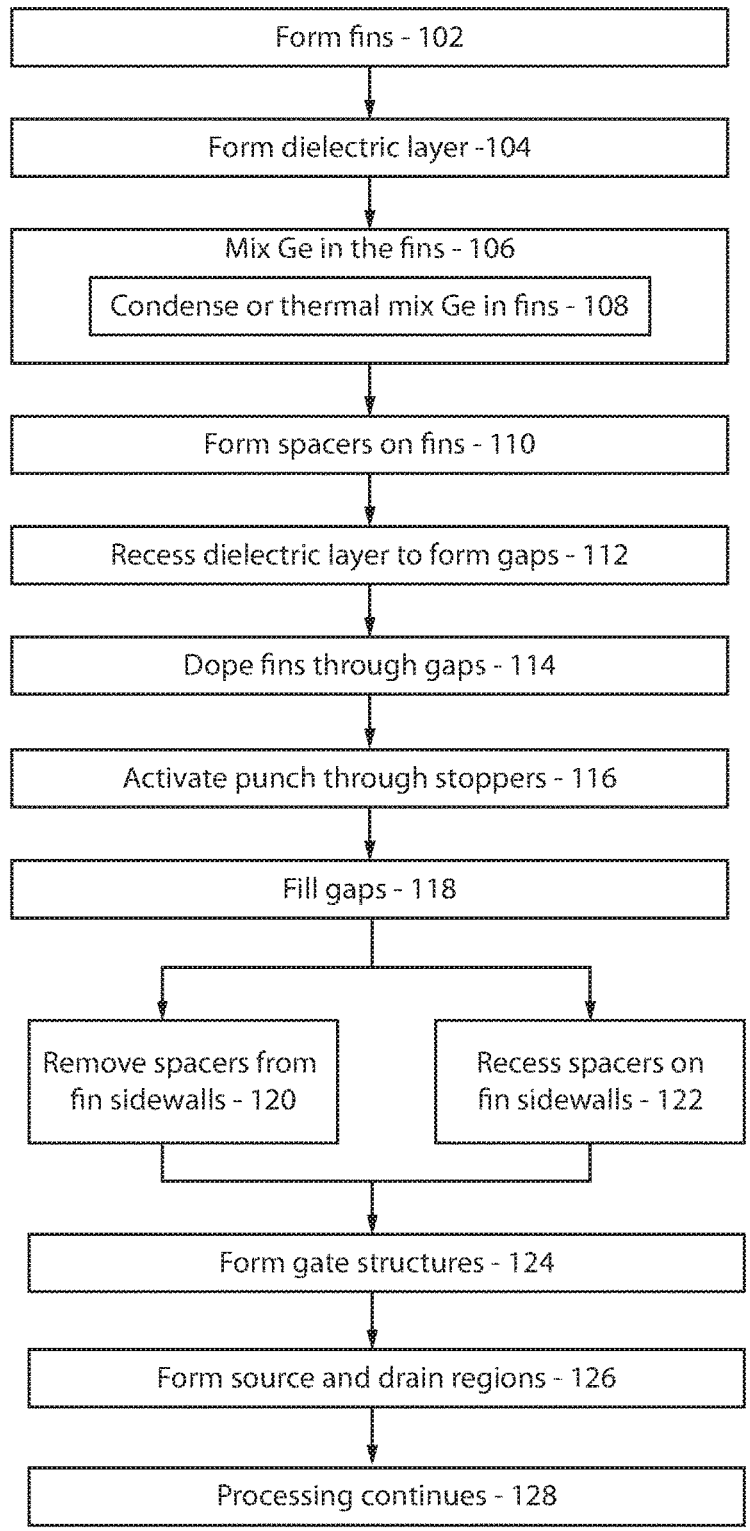
FIG. 12 is a block/flow diagram showing a method for forming a punch through stopper in accordance with illustrative embodiments.

Referring to FIG. 12, a method for doping PTSs is shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fins are formed in a monocrystalline substrate. The substrate preferably includes Si. The fins are preferably formed from the substrate and are an integral part of the substrate.

In block 104, a dielectric layer is formed at a base portion between the fins. The dielectric layer may include silicon dioxide.

In block 106, in one embodiment, Ge may be mixed in the fins to form SiGe fins, wherein the SiGe fins extend into the monocrystalline Si substrate below the dielectric layer. In block 108, the mixing may include thermal mixing or condensation of Ge to form the SiGe fins. This may include depositing a SiGe layer on the fins and oxidizing and annealing the SiGe layer to condense Ge and diffuse the Ge into the fins. The SiGe fins extend into the monocrystalline substrate below the dielectric layer.

In block 110, spacers are formed on sidewalls of the fins down to a top portion of the dielectric layer. In block 112, the dielectric layer is recessed (thinned) to form gaps between the top portion of the dielectric layer and the spacer to expose the fins in the gaps. In block 114, the fins are doped through the gaps to form PTSs in the fins. The doping may include plasma doping the sides of the fins through the gaps.

In block 116, the PTSs are activated, e.g., by laser annealing. In block 118, the gaps are filled with a same dielectric material as the dielectric layer, which is etched back to a position on the spacers. In block 120, the spacers are removed from sidewalls of the fins to expose a channel portion of the fin above the PTSs. In block 122, the spacers are recessed down to the dielectric layer to expose a channel portion of the fin above the PTSs.

In block 124, a gate structure is formed over a channel portion of the fin. The gate structure may include a gate conductor with spacers along sidewalls and a gate dielectric in contact with the fin. The spacers may include a silicon nitride material. In block 126, source and drain regions are formed adjacent to the gate and channel portions. In block 128, processing continues as needed.

Having described preferred embodiments for localized and self-aligned punch through stopper doping for finFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims.

The invention claimed is:

1. A method for doping punch through stoppers (PTSs), comprising:
    recessing a dielectric layer to form gaps between a top portion of the dielectric layer and a spacer formed on sidewalls of SiGe fins to expose the SiGe fins in the gaps; wherein the SiGe fins extend into a monocrystalline substrate below the dielectric layer; and
    doping the fins through the gaps to form PTSs in the fins, wherein a doped region extends from a bottom surface of the PTSs into the monocrystalline substrate.

2. The method as recited in claim 1, wherein the substrate includes monocrystalline Si, and the method further comprises mixing Ge in the SiGe fins to form the SiGe fins.

3. The method as recited in claim 2, wherein mixing Ge in the fins to form SiGe fins includes depositing a SiGe layer on the fins and oxidizing the SiGe layer to condense Ge and diffuse the Ge into the fins.

4. The method as recited in claim 1, wherein doping the fins includes plasma doping sides of the fins through the gaps.

5. The method as recited in claim 1, further comprising annealing the PTSs to activate the PTSs.

6. The method as recited in claim 1, further comprising filling the gaps with a same dielectric material as the dielectric layer and etching back the dielectric layer to a position on the spacers.

7. The method as recited in claim 6, further comprising removing the spacers to expose a channel portion of the fin above the PTSs.

8. The method as recited in claim 6, further comprising recessing the spacers down to the dielectric layer to expose a channel portion of the fin above the PTSs.

9. A method for doping punch through stoppers (PTSs), comprising:
    forming SiGe fins extending into a monocrystalline substrate below a dielectric layer;
    forming spacers on sidewalls of the fins down to a top portion of the dielectric layer;
    recessing the dielectric layer to form self-aligned gaps between the top portion of the dielectric layer and the spacer to expose the fins in the gaps;
    plasma doping the fins through the gaps to form PTSs in the fins, wherein a doped region extends from a bottom surface of the PTSs into the substrate;
    activating the PTSs by annealing.

10. The method as recited in claim 9, wherein forming the SiGe tins includes mixing Ge in the SiGe fins to form the SiGe fins by depositing a SiGe layer on the fins and oxidizing the SiGe layer to condense Ge and diffuse the Ge into the SiGe fins.

11. The method as recited in claim 9, further comprising removing the spacers to expose a channel portion of the fin above the PTSs.

12. The method as recited in claim 9, further comprising recessing the spacers to expose a channel portion of the fin above the PTSs.

13. The method as recited in claim 9, wherein the fins include a channel portion on a first side of the PTS and a second portion on a second side of the PTS formed in the substrate.

14. The method as recited in claim 13, wherein the channel portion includes a p-type fin field effect transistor channel and the plasma doping includes n-type dopants.

15. A fin device having a punch through stopper (PTS), comprising:
    an SiGe fin disposed between source and drain regions and adjacent to a gate structure;
    the SiGe fin having a first portion extending above a top surface of a monocrystalline substrate and a second portion buried below the top surface of the monocrystalline substrate below a dielectric layer; and
    the first portion extending above the top surface of the monocrystalline substrate including a PTS region, wherein the PTS region includes a doped region extending from a bottom surface of the PTS into the monocrystalline substrate.

16. The device as recited in claim 15, wherein the PTS region is between 10 nm and 50 nm in thickness.

17. The device as recited in claim 15, wherein the device includes a p-type fin field effect transistor.

18. The device as recited in claim 17, wherein the PTS region includes n-type dopants having a concentration of between about $1 \times 10^{17}$ and $1 \times 10^{20}$ $cm^{-3}$.

19. The device as recited in claim 15, wherein the fin device includes a gate structure including a gate dielectric and gate conductor formed on top of the fin.

* * * * *